(12) United States Patent
Imai et al.

(10) Patent No.: US 11,630,347 B2
(45) Date of Patent: Apr. 18, 2023

(54) DISPLAY DEVICE

(71) Applicant: Japan Display Inc., Tokyo (JP)

(72) Inventors: Takayuki Imai, Tokyo (JP); Masayuki Ikari, Tokyo (JP)

(73) Assignee: Japan Display Inc., Tokyo (JP)

( * ) Notice: Subject to any disclaimer, the term of this patent is extended or adjusted under 35 U.S.C. 154(b) by 28 days.

(21) Appl. No.: 17/305,408

(22) Filed: Jul. 7, 2021

(65) Prior Publication Data

US 2022/0011638 A1 Jan. 13, 2022

(30) Foreign Application Priority Data

Jul. 10, 2020 (JP) .............................. JP2020-119199

(51) Int. Cl.
*G02F 1/13357* (2006.01)
*G02F 1/1362* (2006.01)
*G02F 1/1335* (2006.01)

(52) U.S. Cl.
CPC .. *G02F 1/133615* (2013.01); *G02F 1/133616* (2021.01); *G02F 1/136286* (2013.01)

(58) Field of Classification Search
CPC ............. G02F 1/133615; G02F 1/1334; G02F 1/136826; G02F 1/133616
See application file for complete search history.

(56) References Cited

U.S. PATENT DOCUMENTS

2017/0269433 A1* 9/2017 Sugiyama ............ G02B 6/0031
2022/0221644 A1* 7/2022 Gou ...................... G02B 6/0078

FOREIGN PATENT DOCUMENTS

JP 2003-084278 A 3/2003

* cited by examiner

*Primary Examiner* — Dung T Nguyen

(74) *Attorney, Agent, or Firm* — Maier & Maier, PLLC

(57) ABSTRACT

According to one embodiment, a display device includes a first transparent substrate having a first side surface extending over a first area, a second area and a third area, a second transparent substrate opposed to the first transparent substrate in the third area, a polymer dispersed liquid crystal layer, a first wiring board mounted with a first light-emitting element in the first area, a second wiring board mounted with a second light-emitting element in the second area, a first terminal connected to a power supply in the first area, a second terminal connected to the second wiring board in the second area, and a first conductive layer arranged on the first side surface and connected to the first terminal and the second terminal.

12 Claims, 11 Drawing Sheets

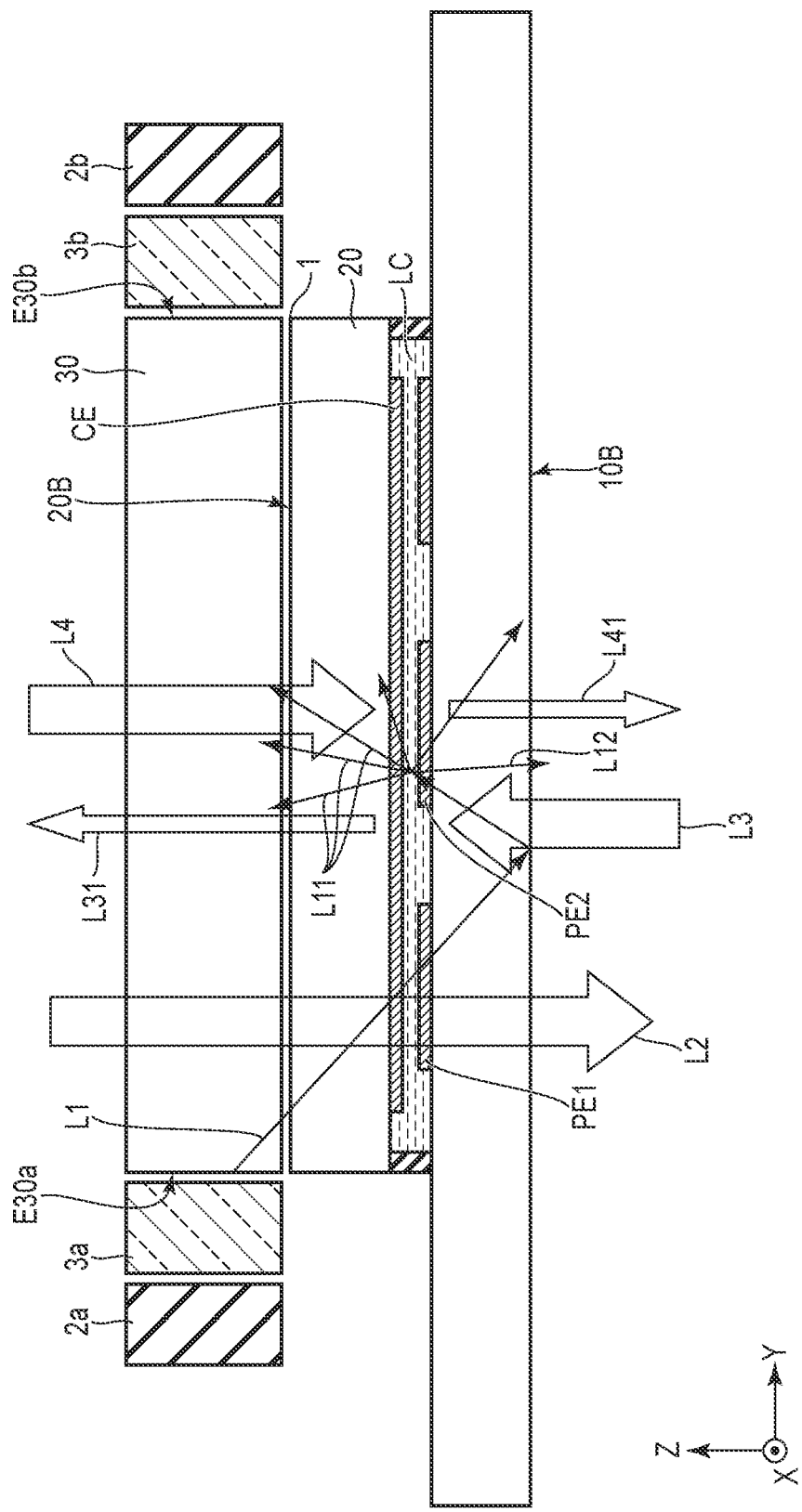
F I G. 4

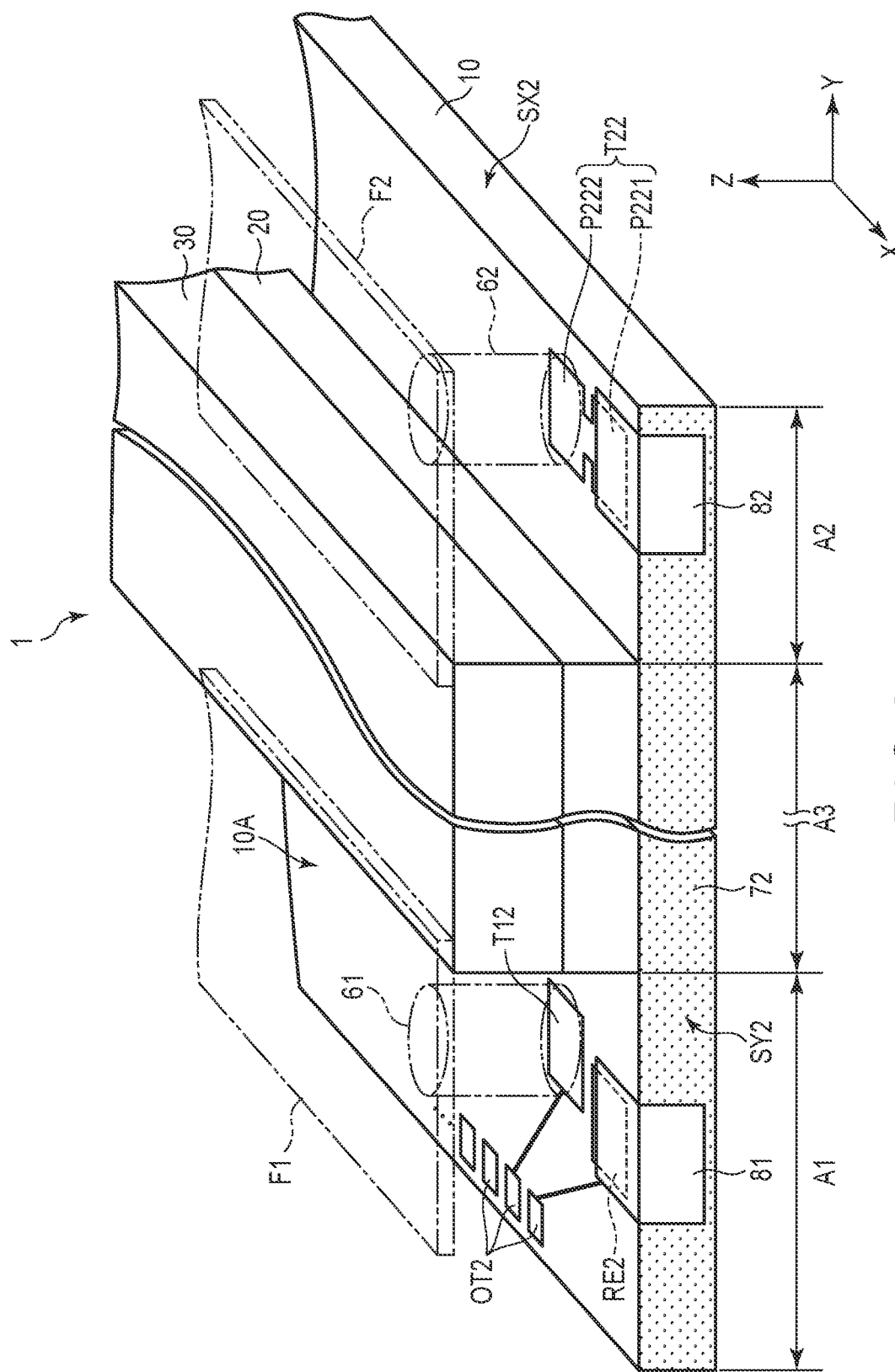
F I G. 6

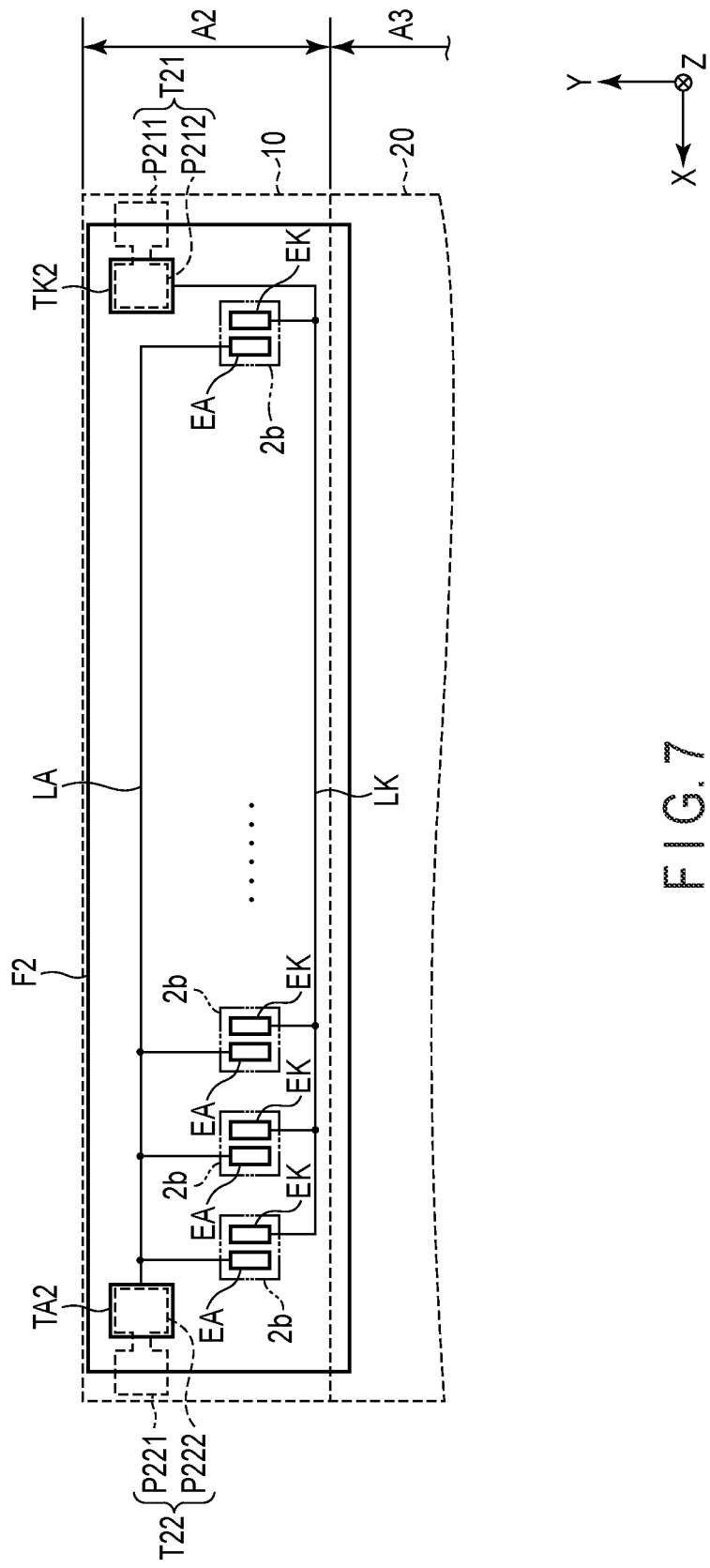
F I G. 7

DISPLAY DEVICE

CROSS-REFERENCE TO RELATED APPLICATIONS

This application is based upon and claims the benefit of priority from Japanese Patent Application No. 2020-119199, filed Jul. 10, 2020, the entire contents of which are incorporated herein by reference.

FIELD

Embodiments described herein relate generally to a display device.

BACKGROUND

Recently, various display devices using a polymer dispersed liquid crystal (hereinafter referred to also as PDLC) capable of switching between a diffusion state of diffusing incident light and a transmission state of transmitting incident light have been proposed. In many cases, the display device using the PDLC comprises an illumination device for radiating light to a display panel. As an example of the illumination device, a configuration comprising a light guide facing the display panel and a light-emitting element emitting light to the light guide is known.

When the light-emitting elements are arranged on both one end side and the other end side of the liquid guide, wiring lines and cables for supplying voltage to the light-emitting elements are drawn from both one end side and the other end side of the light guide, and a housing for accommodating them is required in many cases.

BRIEF DESCRIPTION OF THE DRAWINGS

FIG. 4 is an illustration for explaining the display operation of the display panel.

FIG. 6 is a perspective view of the display panel shown in FIG. 5.

FIG. 7 is a plan view showing a configuration example of a wiring board overlapping a second area shown in FIG. 5.

DETAILED DESCRIPTION

Figure 1:
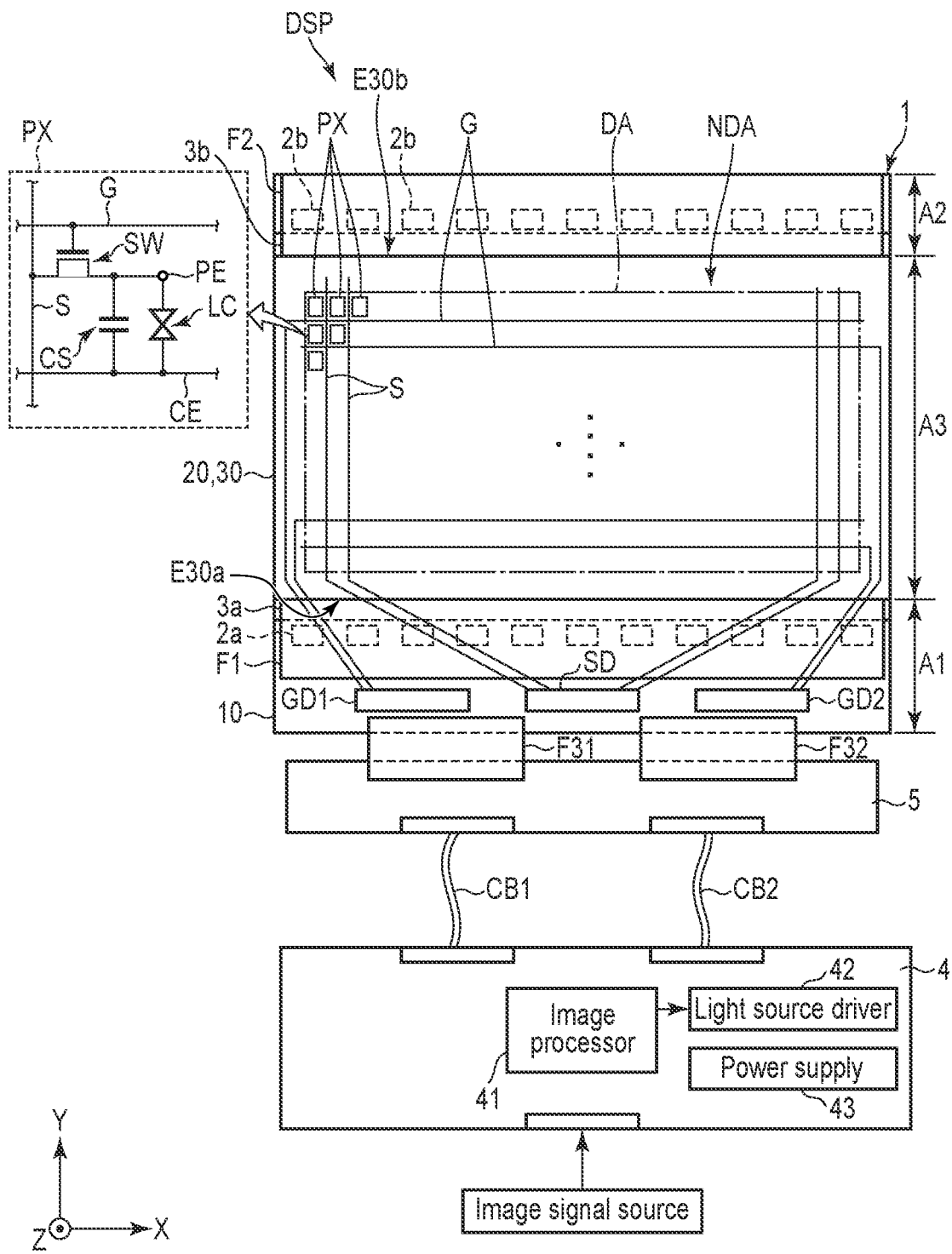
FIG. 1 is a plan view showing an example of the external appearance of a display device according to the first embodiment.

In general, according to one embodiment, there is provided a display device comprising: a first transparent substrate having a first area, a second area, a third area located between the first area and the second area, and a first side surface extending over the first area, the second area and the third area; a second transparent substrate opposed to the first transparent substrate in the third area; a polymer dispersed liquid crystal layer held between the first transparent substrate and the second transparent substrate, and containing a polymer and liquid crystal molecules; a third transparent substrate arranged on the second transparent substrate, and having one end portion between the first area and the third area and another end portion between the second area and the third area; a first wiring board located directly above the first area, and mounted with a first light-emitting element opposed to the one end portion; a second wiring board located directly above the second area, and mounted with a second light-emitting element opposed to the other end portion; a power supply supplying power to the first light-emitting element and the second light-emitting element; a first terminal arranged in the first area, and electrically connected to the power supply; a second terminal opposed to the second wiring board in the second area, and electrically connected to the second wiring board; and a first conductive layer arranged on the first side surface, and electrically connected to the first terminal and the second terminal.

According to another embodiment, there is provided a display device comprising: a first transparent substrate having a first area, a second area, and a third area located between the first area and the second area; a second transparent substrate opposed to the first transparent substrate in the third area; a liquid crystal layer held between the first transparent substrate and the second transparent substrate; a first lower terminal arranged in the first area; a second lower terminal arranged in the second area; a first wiring board located directly above the first area, and having a first upper terminal opposed to the first lower terminal; a second wiring board located directly above the second area, and having a second upper terminal opposed to the second lower terminal; a first light-emitting element mounted on the first wiring board, and electrically connected to the first upper terminal; a second light-emitting element mounted on the second wiring board, and electrically connected to the second upper terminal; a first connecting member arranged between the first lower terminal and the first upper terminal, and electrically connecting the first lower terminal and the first upper terminal; and a second connecting member arranged between the second lower terminal and the second upper terminal, and electrically connecting the second lower terminal and the second upper terminal.

According to yet another embodiment, there is provided a display device comprising: a first transparent substrate having a first area, a second area, a third area located between the first area and the second area, a first side surface extending over the first area, the second area and the third area, a second side surface intersecting the first side surface, and a third side surface located on an opposite side to the first side surface; a second transparent substrate overlapping the first transparent substrate in the third area; a liquid crystal layer held between the first transparent substrate and the second transparent substrate; a third terminal arranged in the first area; a first terminal arranged in the first area, and located between the first side surface and the third terminal; a fourth terminal arranged in the first area, and located between the third side surface and the third terminal; a second terminal and a fifth terminal arranged in the second area, and arranged along the second side surface; a first reflective layer having conductivity, and arranged on the first side surface; a third reflective layer having conductivity, and arranged on the third side surface; a second reflective layer having conductivity, arranged close to the first side surface on the second side surface, and electrically connected to the first reflective layer; and a fourth reflective layer having conductivity, arranged close to the third side surface on the second side surface, electrically connected to the third reflective layer, and being apart from the second reflective layer. The first terminal and the second terminal are electrically connected via the first reflective layer and the second reflective layer. The fourth terminal and the fifth terminal are electrically connected via the third reflective layer and the fourth reflective layer.

Embodiments will be described hereinafter with reference to the accompanying drawings. The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes and the like, of the respective parts are illustrated schematically in the drawings, rather than as an accurate representation of what is implemented. However, such schematic illustration is merely exemplary, and in no way restricts the interpretation of the invention. In addition, in the specification and drawings, constituent elements which function in the same or a similar manner to those described in connection with preceding drawings are denoted by the same reference signs, and detailed descriptions thereof which are considered redundant are omitted unless necessary.

FIG. 1 is a plan view showing an example of the external appearance of a display device DSP according to the first embodiment. A first direction X, a second direction Y and a third direction Z shown in the drawing are orthogonal to one another, but may intersect at an angle other than 90 degrees. The first direction X and the second direction Y correspond to directions parallel to the main surface of a substrate constituting the display device DSP, and the third direction Z corresponds to the thickness direction of the display device DSP. In the specification, viewing an X-Y plane defined by the first direction X and the second direction Y is referred to as planar view.

In the present embodiment, a display device employing a polymer dispersed liquid crystal is described as an example of the display device. The display device DSP comprises a display panel 1, light-emitting elements 2 (2a and 2b), optical elements 3 (3a and 3b), a control board 4, a relay board 5, gate drivers GD (GD1 and GD2), a source driver SD, wiring boards F1, F2 and F3 (F31 and F32) and the like.

The display panel 1 has a quadrangular shape in one example, and has a substantially rectangular shape in which the length of sides along the first direction X is greater than the length of sides along the second direction Y in the illustrated example. The display panel 1 comprises a transparent substrate 10, a transparent substrate 20 and a transparent substrate 30. The transparent substrate 10 and the transparent substrate 20 overlap each other in the third direction Z, and hold a polymer dispersed liquid crystal layer (liquid crystal layer LC which will be described later) therebetween. The transparent substrate 30 overlaps the transparent substrate 20. In one example, the transparent substrate 30 has the same shape as the transparent substrate 20.

The transparent substrate 10 has a first area A1, a second area A2 and a third area A3. In one example, the first area A1 and the second area A2 are arranged in the second direction Y. The third area A3 is located between the first area A1 and the second area A2. In the illustrated example, the first area A1, the second area A2 and the third area A3 all have a substantially rectangular shape having long sides along the first direction X. The transparent substrate 20 is arranged in the third area A3. In other words, the third area A3 corresponds to an area in which the transparent substrate 10 and the transparent substrate 20 overlap each other. In addition, the first area A1 and the second area A2 each correspond to an area in which the transparent substrate 10 extends more outward than the transparent substrate 20. The transparent substrate 30 has an end portion E30a located on the first area A1 side, and an end portion E30b located on the second area A2 side. The end portion E30a overlaps a border between the first area A1 and the third area A3. The end portion E30b overlaps a border between the second area A2 and the third area A3. In one example, the end portions E30a and E30b extend in the first direction X. The transparent substrate 30 functions as a light guide for illuminating the display panel 1.

In the third area A3, that is, in an area in which the liquid crystal layer is disposed, the display panel 1 has a display area DA for displaying an image. In the display area DA, the display panel 1 comprises a plurality of scanning lines G and a plurality of signal lines S. In one example, the scanning lines G each extend in the first direction X, and are arranged at intervals in the second direction Y. The signal lines S each extend in the second direction Y, and are arranged at intervals in the first direction X. In addition, the display area DA comprises pixels PX arranged in a matrix in the first direction X and the second direction Y.

As shown enlarged in FIG. 1, each pixel PX comprises a switching element SW, a pixel electrode PE, a common electrode CE, a liquid crystal layer LC and the like. The switching element SW is composed of, for example, a thin-film transistor (TFT), and is electrically connected to the scanning line G and the signal line S. The scanning line G is electrically connected to the switching element SW in each of the pixels PX arranged in the first direction X. The signal line S is electrically connected to the switching element SW in each of the pixels PX arranged in the second direction Y. The pixel electrode PE is electrically connected to the switching element SW. The common electrode CE is disposed common to the pixel electrodes PE. The liquid crystal layer LC (particularly, liquid crystal molecules contained in the liquid crystal layer LC) is driven by an electric field generated between the pixel electrode PE and the common electrode CE. A capacitance CS is formed, for example, between an electrode having the same potential as the common electrode CE and an electrode having the same potential as the pixel electrode PE.

In one example, the gate drivers GD and the source driver SD are mounted on the first area A1, and are arranged in the first direction X. In the illustrated example, the source driver SD is arranged between the gate driver GD1 and the gate driver GD2. The signal lines S are drawn to a non-display area NDA, and are connected to the source driver SD. The scanning lines G are drawn to the non-display area NDA, and are connected to the gate drivers GD1 and GD2. It should be noted that the number of gate drivers GD and the number of source drivers SD provided in the display device DSP, the connection relationship between the signal lines S and the source driver SD, and the connection relationship between the scanning lines G and the gate driver GD and the like are not limited to the illustrated example. In addition, all or part of the functions of the gate driver GD and the source driver SD may be mounted on another board such as the wiring board F3, the control board 4 or the relay board 5.

The light-emitting elements 2a overlap the first area A1, and are arranged at equal intervals in the first direction X. In the illustrated example, the light-emitting elements 2a are closer to the transparent substrate 30 than the gate drivers GD and the source driver SD. The light-emitting elements 2b overlap the second area A2, and are arranged at equal intervals in the first direction X. In one example, the light-emitting elements 2a and 2b each are a light-emitting diode (LED), and each comprise the first light-emitting portion which emits light having the first color, the second light-emitting portion which emits light having the second color, and the third light-emitting portion which emits light having the third color. In one example, the first color is red, the second color is green, and the third color is blue.

The optical element 3a is located between the light-emitting elements 2a and the transparent substrate 30 in the first area A1. In the illustrated example, the optical element 3a extends in the first direction X, and is opposed to the light-emitting elements 2a. The optical element 3b is located between the light-emitting elements 2b and the transparent substrate 30 in the second area A2. In the illustrated example, the optical element 3b extends in the first direction X, and is opposed to the light-emitting elements 2b. The optical elements 3a and 3b each convert incident light into parallel light in one example, but may diffuse incident light as needed. Light emitted from the light-emitting elements 2a enters the transparent substrate 30 from the end portion E30a via the optical element 3a, and light emitted from the light-emitting elements 2b enters the transparent substrate 30 from the end portion E30b via the optical element 3b.

The control board 4 comprises an image processor 41, a light source driver 42, a power supply 43 and the like. The image processor 41 includes a timing controller. The image processor 41 generates various signals based on image data, a synchronization signal and the like which are input from the outside. In one example, the image processor 41 outputs an image signal generated through predetermined signal processing of the image data to the source driver SD. In addition, the image processor 41 outputs a control signal generated based on the synchronization signal to each of the gate drivers GD, the source driver SD and the light source driver 42. The light source driver 42 controls the lighting period of the light-emitting elements 2a and 2b according to the control signal from the image processor 41 and the like. In a drive method in which one frame period has a plurality of sub-frame (field) periods, at least one of the above-described three light-emitting portions is turned on in each sub-frame, and the color of illumination light is switched for each sub-frame. In addition, the light source driver 42 supplies power from the power supply 43 to the light-emitting elements 2a and 2b.

The wiring board F1 overlaps the first area A1, and is electrically connected to the light-emitting elements 2a. The wiring board F2 overlaps the second area A2, and is electrically connected to the light-emitting elements 2b. The wiring boards F3 are mounted on the first area A1. In the illustrated example, two wiring boards F31 and F32 are mounted on the first area A2. In one example, the wiring board F31 is located on the gate driver GD1 side, and the wiring board F32 is located on the gate driver GD2 side. The wiring boards F3 physically and electrically connect the display panel 1 and the relay board 5. More specifically, the wiring boards F3 electrically connect the light-emitting elements 2a and 2b, the gate drivers GD and the source driver SD, and the relay board 5. The relay board 5 is electrically connected to the control board 4 via cables CB1 and CB2. Therefore, the operation of the light-emitting elements 2a and 2b is controlled by the light source driver 42 provided in the control board 4 via the wiring boards F3, the relay board 5 and the cables CB1 and CB2.

Figure 2:
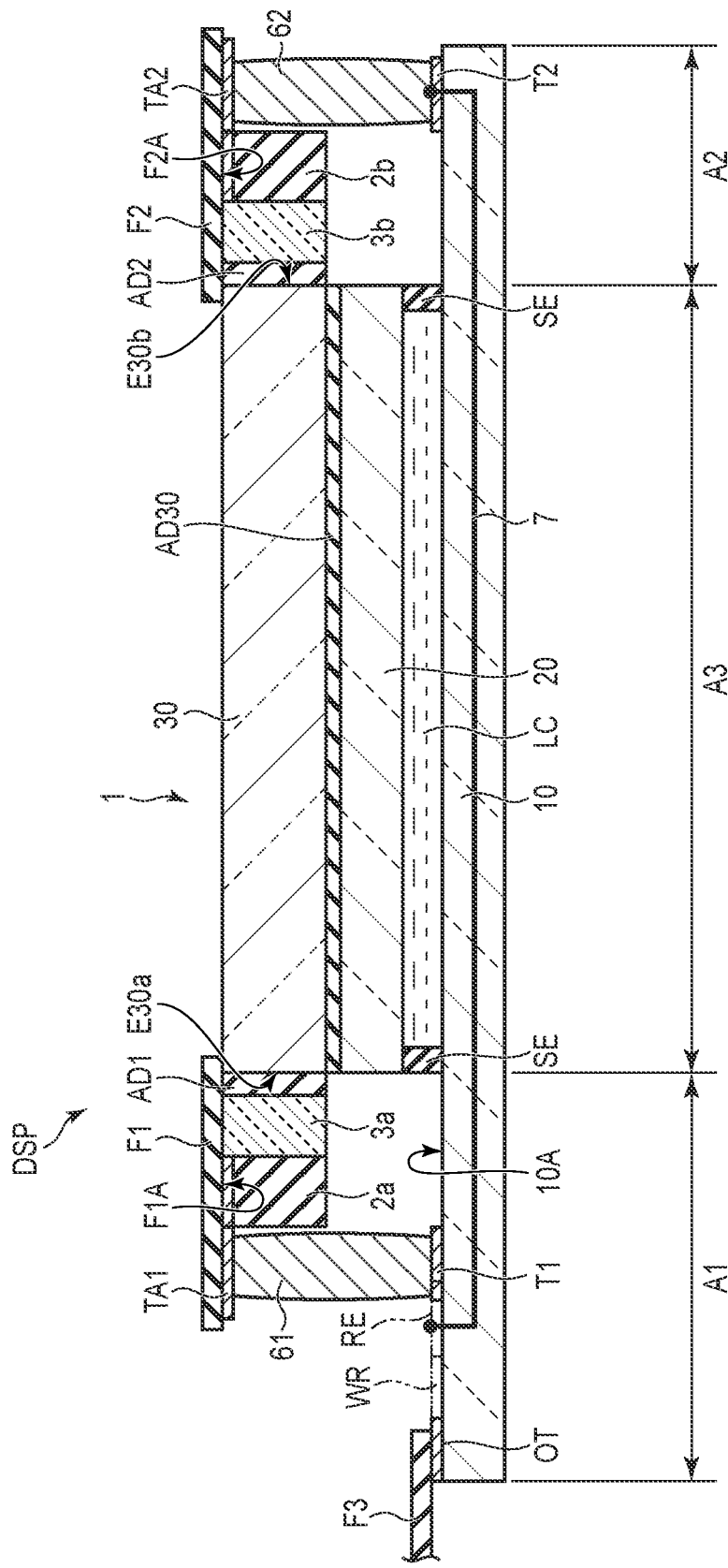
FIG. 2 is a cross-sectional view showing a configuration example of the display device shown in FIG. 1.

FIG. 2 is a cross-sectional view showing a configuration example of the display device DSP shown in FIG. 1. FIG. 2 shows a plane parallel to a Y-Z plane. The display device DSP comprises connecting members 61 and 62 and a conductive layer 7 in addition to the display panel 1, the light-emitting elements 2a and 2b, the optical elements 3a and 3b, the wiring boards F1, F2 and F3.

In the display panel 1, the transparent substrate 10 has a main surface 10A facing the transparent substrate 20. The main surface 10A extends over the first area A1, the second area A2 and the third area A3. The transparent substrate 20 is opposed in the third direction Z to the transparent substrate 10 in the third area A3. The transparent substrate 10 and the transparent substrate 20 are bonded together by a sealant SE. The liquid crystal layer LC is held inside an area surrounded by the sealant SE. The transparent substrate 30 is arranged on the transparent substrate 20. In the illustrated example, the transparent substrate 30 and the transparent substrate 20 are bonded together by an adhesive AD30.

In addition, the display panel 1 has terminals OT, T1 and RE arranged on the main surface 10A in the first area A1, and a terminal T2 arranged on the main surface 10A in the second area A2. In the first area A1, the terminal OT overlaps one end portion of the wiring board F3, and is connected to the wiring board F3. The terminal T1 is connected to the terminal OT by an unillustrated wiring line. The terminal RE is connected to the terminal OT by a wiring line WR. Therefore, the terminal T1 and the terminal RE each are electrically connected to the wiring board F3.

The wiring board F1 is located directly above the first area A1. The light-emitting element 2a is mounted on a lower surface F1A of the wiring board F1. The light-emitting element 2a is opposed to the end portion E30a of the transparent substrate 30 via the optical element 3a. In the illustrated example, the optical element 3a is bonded to the end portion E30a of the transparent substrate 30 by an adhesive AD1. The wiring board F1 has a terminal TA1 electrically connected to the light-emitting element 2a. The terminal TA1 is located on the lower surface F1A, and is opposed to the terminal T1 arranged in the first area A1. The connecting member 61 is arranged between the terminal TA1 and the terminal T1, and electrically connects these two. Accordingly, the wiring board F3 and the wiring board F1 are electrically connected together.

The wiring board F2 is located directly above the second area A2. The light-emitting element 2b is mounted on a lower surface F2A of the wiring board F2. The light-emitting element 2b is opposed to the end portion E30b of the transparent substrate 30 via the optical element 3b. In the illustrated example, the optical element 3b is bonded to the end portion E30b of the transparent substrate 30 by an adhesive AD2. The wiring board F2 has a terminal TA2 electrically connected to the light-emitting element 2b. The terminal TA2 is located on the lower surface F2A, and is opposed to the terminal T2 arranged in the second area A2. The connecting member 62 is arranged between the terminal TA2 and the terminal T2, and electrically connects these two.

In the present embodiment, the terminal RE arranged in the first area A1 and the terminal T2 arranged in the second area A2 are electrically connected via the conductive layer 7. The conductive layer 7 is arranged on a side surface of the transparent substrate 10. The side surface here is a side surface extending in a direction in which the first area A1 and the second area A2 are arranged, that is, in the second direction Y. FIG. 2 is a cross-sectional view of the display panel 1, and the side surface provided with the conductive layer 7 will be described with reference to FIG. 5 and the like. The conductive layer 7 electrically connects the terminal RE and the terminal T2 so that the wiring board F3 and the wiring board F2 are electrically connected together.

Figure 3:
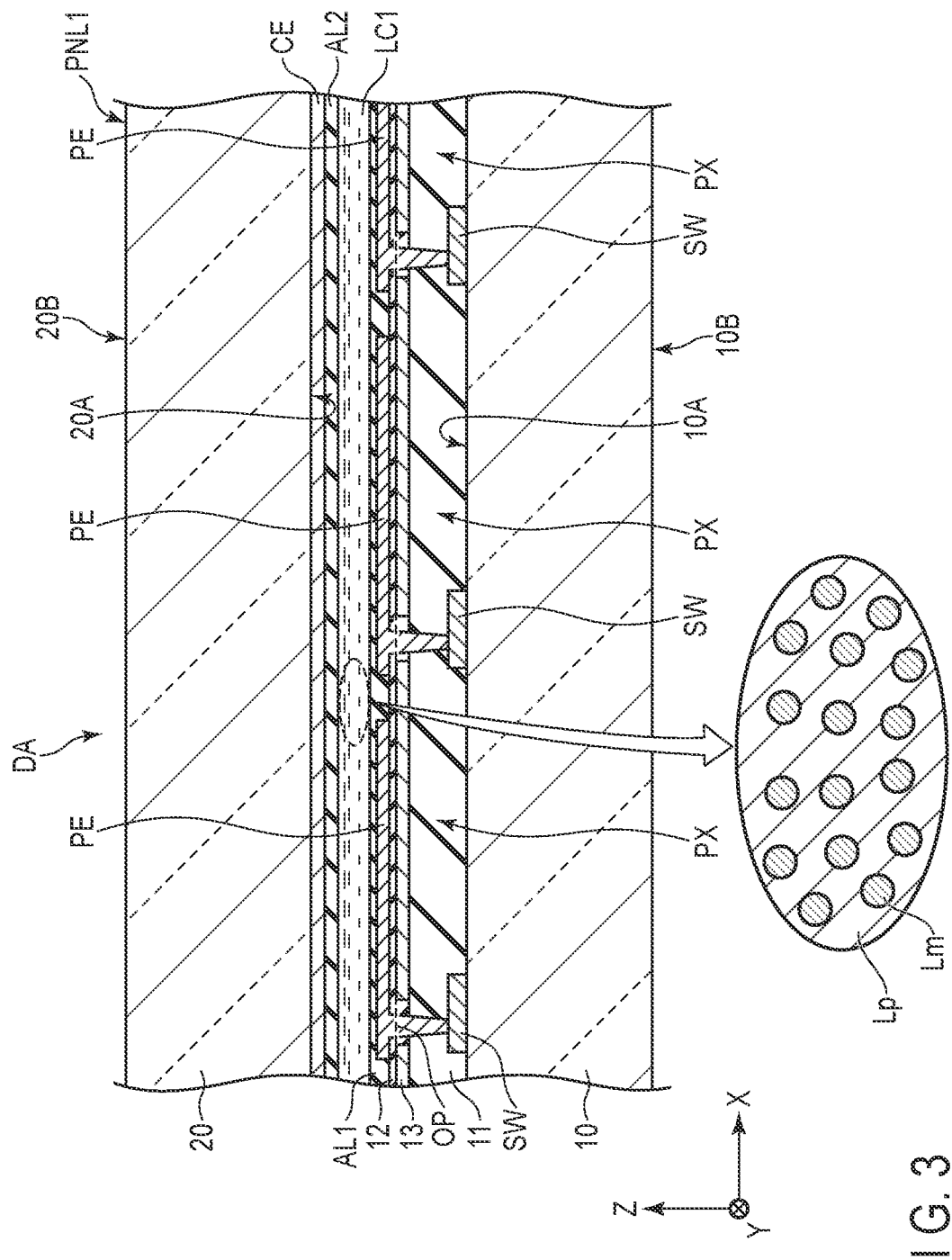
FIG. 3 is a cross-sectional view showing a configuration example of a display panel.

FIG. 3 is a cross-sectional view showing a configuration example of the display panel 1. The display panel 1 comprises insulating films 11 and 12, a capacitance electrode 13 and alignment films AL1 and AL2 in addition to the transparent substrate 10, the transparent substrate 20, the liquid crystal layer LC, the transparent substrate 30, the switching element SW, the pixel electrode PE and the common electrode CE.

The transparent substrate 10 has the main surface (inner surface) 10A facing the transparent substrate 20, and a main surface (outer surface) 10B on the opposite side to the main surface 10A. The switching element SW is formed on the main surface 10A side. The insulating film 11 is formed on the main surface 10A, and covers the switching element SW. The scanning line G and the signal line S shown in FIG. 1 are disposed between the transparent substrate 10 and the insulating film 11, but the illustrations thereof are omitted here. The capacitance electrode 13 is arranged between the insulating films 11 and 12. The pixel electrode PE is arranged for each pixel PX between the insulating film 12 and the alignment film AL1. That is, the capacitance electrode 13 is arranged between the transparent substrate 10 and the pixel electrode PE. The pixel electrode PE is electrically connected to the switching element SW via an opening OP of the capacitance electrode 13. The pixel electrode PE overlaps the capacitance electrode 13 across the insulating film 12, and forms the capacitance CS of the pixel PX. The alignment film AL1 covers the pixel electrode PE.

The transparent substrate 20 has a main surface (inner surface) 20A facing the transparent substrate 10, and a main surface (outer surface) 20B on the opposite side to the main surface 20A. The common electrode CE is arranged on the main surface 20A. The alignment film AL2 covers the common electrode CE. It should be noted that a light-shielding layer may be disposed directly above each of the switching element SW, the scanning line G and the signal line S. In addition, a transparent insulating film may be disposed between the transparent substrate 20 and the common electrode CE or between the common electrode CE and the alignment film AL2. The common electrode CE is arranged over the pixels PX, and is opposed to the pixel electrodes PE in the third direction Z. In addition, the common electrode CE is electrically connected to the capacitance electrode 13, and has the same potential as the capacitance electrode 13.

The liquid crystal layer LC is held between the alignment film AL1 and the alignment film AL2, and is in contact with these two. In other words, the liquid crystal layer LC is located between the pixel electrode PE and the common electrode CE. In the present embodiment, the liquid crystal layer LC is formed of a polymer dispersed liquid crystal containing a polymer Lp which is a macromolecule, and liquid crystal molecules Lm. In one example, the polymer Lp is a liquid crystal polymer. The polymer Lp is obtained by, for example, polymerizing liquid crystal monomers in a state of being aligned in a predetermined direction by an alignment regulating force of the alignment films AL1 and AL2. The liquid crystal molecules Lm are dispersed in the gaps of the polymer Lp, and are aligned such that the major axes thereof are along the alignment regulating force of the alignment films AL1 and AL2. In the enlarged part in the drawing, the polymer Lp is shown by downward-sloping diagonal lines, and the liquid crystal molecules Lm are shown by upward-sloping diagonal lines.

The polymer Lp and the liquid crystal molecule Lm each have optical anisotropy or refractive anisotropy. When the optical axis of the polymer Lp and the optical axis of the liquid crystal molecule Lm are parallel to each other, the ordinary refractive index of the polymer Lp and the ordinary refractive index of the liquid crystal molecule Lm are almost equal, and the extraordinary refractive index of the polymer Lp and the extraordinary refractive index of the liquid crystal molecule Lm are almost equal. Therefore, there is hardly any refractive index difference between the polymer Lp and the liquid crystal molecule Lm. Light entering the liquid crystal layer LC is transmitted almost without being scattered in the liquid crystal layer LC. This state is hereinafter referred to as a transparent state. On the other hand, when the optical axis of the polymer Lp and the optical axis of the liquid crystal molecule Lm are not parallel to each other, there is a refractive index difference between the polymer Lp and the liquid crystal molecule Lm. Accordingly, light entering the liquid crystal layer LC is scattered in the liquid crystal layer LC. This state is hereinafter referred to as a scattering state.

The responsiveness to an electric field of the polymer Lp is lower than the responsiveness to an electric field of the liquid crystal molecule Lm. In one example, the alignment direction of the polymer Lp hardly changes with or without an electric field. On the other hand, the alignment direction of the liquid crystal molecule Lm changes according to an electric field in a state where a high voltage of greater than or equal to a threshold value is applied to the liquid crystal layer LC. Therefore, the transparent state and scattering state of the liquid crystal layer LC can be controlled by voltage applied to the liquid crystal layer LC, more specifically, by voltage applied between the pixel electrode PE and the common electrode CE.

When voltage is not applied between the pixel electrode PE and the common electrode CE, the optical axis of the polymer and the optical axis of the liquid crystal molecule contained in the liquid crystal layer LC are parallel to each other, and the liquid crystal layer LC is in the transparent state. When voltage is applied to the pixel electrode PE and the common electrode CE, the optical axis of the polymer and the optical axis of the liquid crystal molecule contained in the liquid crystal layer LC intersect each other, and the liquid crystal layer LC is in the scattering state. The liquid crystal layer LC is formed of, for example, a liquid crystal material having a positive dielectric anisotropy.

The transparent substrate 10 and the transparent substrate 20 each are, for example, a glass substrate, but may each be an insulating substrate such as a plastic substrate. The insulating film 11 includes, for example, a transparent inorganic insulating film of silicon oxide, silicon nitride, silicon oxynitride or the like, and a transparent organic insulating film of acrylic resin or the like. The insulating film 12 is a transparent organic insulating film of silicon nitride or the like. The capacitance electrode 13, the pixel electrode PE and the common electrode CE each are a transparent electrode formed of a transparent conductive material such as indium tin oxide (ITO) or indium zinc oxide (IZO). The alignment films AL1 and AL2 each are a horizontal alignment film having an alignment regulating force substantially parallel to the X-Y plane. In one example, the alignment films AL1 and AL2 are subjected to alignment treatment along the first direction X. The alignment treatment may be rubbing treatment or may be photo-alignment treatment.

FIG. 4 is an illustration for explaining the display operation of the display panel 1. The pixel electrodes PE (PE1 and PE2) and the common electrode CE face each other across the liquid crystal layer LC1. Here, it is assumed that voltage is not applied between the pixel electrode PE1 and the common electrode CE, and voltage is applied between the pixel electrode PE2 and the common electrode CE. In addition, light L1 entering the transparent substrate 30 from the light-emitting element 2a via the optical element 3a will be described below, but the same applies to light entering the transparent substrate 30 from the light-emitting element 2b via the optical element 3b.

The light L1 entering the transparent substrate 30 from the end portion E30a enters the display panel 1 from the transparent substrate 20 side, and propagates through the transparent substrate 20, the liquid crystal layer LC1, the transparent substrate 10 and the like. The liquid crystal layer LC overlapping the pixel electrode PE1 is in the transparent state. Therefore, the light L1 is hardly scattered in an area of the liquid crystal layer LC which overlaps the pixel electrode PE1. On the other hand, the liquid crystal layer LC overlapping the pixel electrode PE2 is in the scattering state. Therefore, the light L1 is scattered in an area of the liquid crystal layer LC which overlaps the pixel electrode PE2. Scattered light L11 which is a part of the light L1 is transmitted through the main surface 20B of the transparent substrate 20, scattered light L12 which is a part of the light L1 is transmitted through the main surface 10B of the transparent substrate 10, and the other scattered light propagates inside the display panel 1.

In an area overlapping the pixel electrode PE1, external light L2 entering the display panel 1 is transmitted almost without being scattered in the liquid crystal layer LC. In an area overlapping the pixel electrode PE2, external light L3 entering from the main surface 10B is scattered in the liquid crystal layer LC, and then light L31 which is a part of the external light L3 is transmitted through the main surface 20B. In addition, external light L4 entering from the main surface 20B is scattered in the liquid crystal layer LC, and then light L41 which is a part of the external light L4 is transmitted through the main surface 10B.

Therefore, when the display panel 1 is observed from the main surface 20B side, the user can visually recognize the color of the light L1 in the area overlapping the pixel electrode PE2. In addition, since the light L31 which is a part of external light is transmitted through the display panel 1, the user can also visually recognize the background on the main surface 10B side through the display panel 1. Similarly, when the display panel 1 is observed from the main surface 10B side, the user can visually recognize the color of the light L1 in the area overlapping the pixel electrode PE2. In addition, since the light L41 which is a part of external light is transmitted through the display panel 1, the user can also visually recognize the background on the main surface 20B side through the display panel 1. In the area overlapping the pixel electrode PE1, since the liquid crystal layer LC is in the transparent state, the color of the light L1 is hardly visually recognized, and the user can visually recognize the background through the display panel 1.

Figure 5:
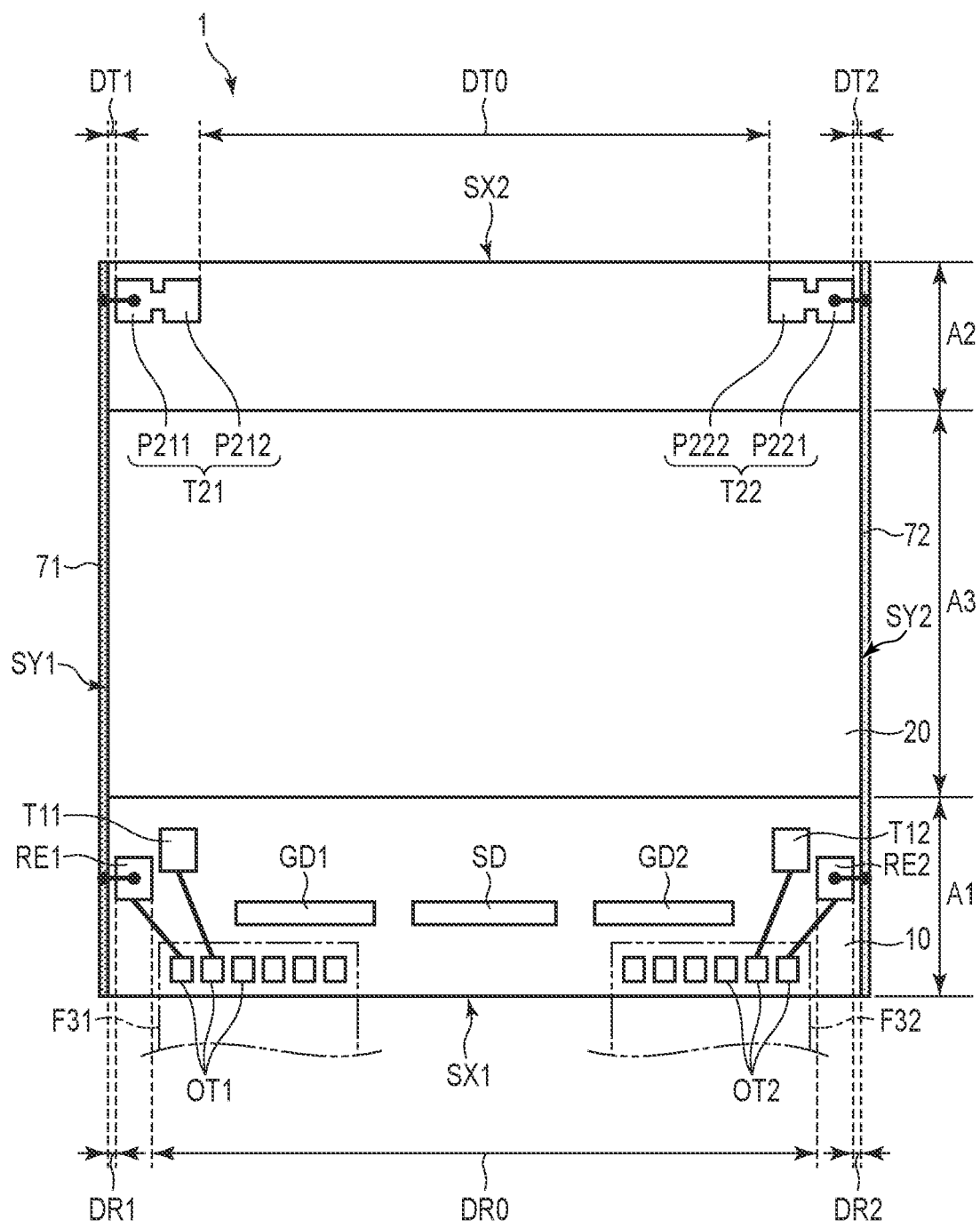
FIG. 5 is a plan view showing a configuration example of the display panel.

FIG. 5 is a plan view showing a configuration example of the display panel 1. The transparent substrate 10 has a substantially rectangular shape, and has side surfaces SX1 and SX2 along the first direction X, and side surfaces SY1 and SY2 along the second direction Y along which the first area A1 and the second area A2 are arranged. That is, the side surfaces SY1 and SY2 extend over the first area A1, the second area A2 and the third area A3. The side surface SX1 extends along the first area A1, and the side surface SX2 extends along the second area A2. The length of the side surfaces SX1 and SX2 is greater than the length of the side surfaces SY1 and SY2 in the illustrated example, but may be less than or equal to the length of the side surfaces SY1 and SY2.

In the first area A1, the display panel 1 has terminals OT1, OT2, T11, T12, RE1 and RE2.

The terminals OT1 and OT2 are arranged along the side surface SX1. In the illustrated example, the terminals OT1 and OT2 are closer to the side surface SX1 than the gate drivers GD and the source driver SD in the second direction Y. The terminals OT1 are located on the side surface SY1 side, and are electrically connected to the wiring board F31. The terminals OT2 are located on the side surface SY2 side, and are electrically connected to the wiring board F32.

The terminals T11 and RE1 are located between the wiring board F31 and the transparent board 20. The terminal T11 is farther from the side surface SY1 than the terminal RE1. The terminals T11 and RE1 are connected to the terminals OT1 via wiring lines, respectively. The terminal T11 and the terminal RE1 are electrically insulated from each other.

The terminals T12 and RE2 are located between the wiring board F32 and the transparent substrate 20. The terminal T12 is farther from the side surface SY2 than the terminal RE2. The terminals T12 and RE2 are connected to the terminals OT2 via wiring lines, respectively. The terminal T12 and the terminal RE2 are electrically insulated from each other. The terminal T1 shown in FIG. 2 corresponds to the terminal T12 shown in FIG. 5.

In the second area A2, the display panel 1 has terminals T21 and T22.

The terminal T21 is arranged on the side surface SY1 side. In the illustrated example, the terminal T21 has a first portion P211 and a second portion P212 which are arranged in the first direction X. The first portion P211 and the second portion P212 are electrically connected or integrally formed. The first portion P211 is closer to the side surface SY1 than the second portion P212.

The terminal T22 is arranged on the side surface SY2 side. In the illustrated example, the terminal T22 has a first portion P221 and a second portion P222 which are arranged in the first direction X. The first portion P221 and the second portion P222 are electrically connected or integrally formed. The first portion P221 is closer to the side surface SY2 than the second portion P222. The terminal T2 shown in FIG. 2 corresponds to the terminal T22 shown in FIG. 5.

The terminal RE1 in the first area A1 and the first portion P211 of the terminal T21 in the second area A2 are electrically connected via a conductive layer 71. The conductive layer 71 is disposed on the side surface SY1. In addition, the terminal RE2 in the first area A1 and the first portion P221 of the terminal T22 in the second area A2 are electrically connected via a conductive layer 72. The conductive layer 72 is disposed on the side surface SY2.

In the first area A1, both a distance DR1 between the terminal RE1 and the side surface SY1 and a distance DR2 between the terminal RE2 and the side surface SY2 are less than a distance DR0 between the terminal RE1 and the terminal RE2. The distance DR1 and the distance DR2 are equal to each other in the illustrated example, but may be different from each other. In addition, in the second area A2, both a distance DT1 between the first portion P211 of the terminal T21 and the side surface SY1 and a distance DT2 between the first portion P221 of the terminal T22 and the side surface SY2 are less than a distance DT0 between the terminal T21 and the terminal T22. The distance DT1 and the distance DT2 are equal to each other in the illustrated example, but may be different from each other. The distances DR0, DR1, DR2, DT0, DT1 and DT2 each are a distance along the first direction X.

FIG. 6 is a perspective view of the display panel 1 shown in FIG. 5. FIG. 6 shows the side surface SY2 side. In one example, the conductive layer 72 is formed by, for example, applying a conductive paste containing a metal material such as silver. The conductive layer 72 is formed over the entire side surface SY2. Although the illustrated is omitted, the conductive layer 71 is formed over the entire side surface SY1 in the same manner. The conductive layers 71 and 72 formed of a metal material also function as a reflective layer which reflects light propagating through the transparent substrate 10.

In the illustrated example, the display device DSP comprises a conductive member 81 and a conductive member 82.

The conductive member 81 electrically connects the terminal RE2 and the conductive layer 72. That is, the conductive member 81 is arranged over the main surface 10A and the side surface SY2 in the first area A1, and are in contact with the terminal RE2 and the conductive layer 72. The conductive member 82 electrically connects the terminal T22 and the conductive layer 72. That is, the conductive member 82 is arranged over the main surface 10A and the side surface SY2 in the second area A2, and are in contact with the terminal T22 and the conductive layer 72. The conductive members 81 and 82 each are, for example, a bendable sheet-shaped member such as a flexible wiring board or a conductive tape, but may each employ another conductive member such as a conductive resin. By providing these conductive members 81 and 82, it is possible to suppress electric rupture at the boundary between the main surface 10A and the side surface SY2.

In the present embodiment, the terminal T22 is in contact with both the conductive member 82 and the connecting member 62. That is, the first portion P221 of the terminal T22 corresponds to a portion overlapping the conductive member 82, and the second portion P222 of the terminal T22 corresponds to a portion overlapping the connecting member 62. As described above, the second portion P222 is farther from the side surface SY2 than the first portion P221. Therefore, the connecting member 62 is farther from the side surface SY2 than the conductive member 82 in the first direction X. In the first area A1, the terminal T12 overlaps the connecting portion 61.

FIG. 7 is a plan view showing a configuration example of the wiring board F2 overlapping the second area A2 shown in FIG. 5. The wiring board F2 has terminals EA, EK, TA2 and TK2. The terminals EA and EK overlap the light-emitting element 2b, and are in contact with an anode electrode and a cathode electrode of the light-emitting element 2b, respectively. Each terminal EA is connected to the terminal TA2 by a wiring line LA. Each terminal EK is connected to the terminal TK2 by a wiring line LK.

The terminal TA2 overlaps the second portion P222 of the terminal T22 arranged on the transparent substrate 10. The connecting member 62 shown in FIG. 6 is interposed between the second portion P222 and the terminal TA2, and electrically connects the second portion P222 and the terminal TA2. The terminal TK2 overlaps the second portion P212 of the terminal T21 arranged on the transparent substrate 10. The same connecting member 62 is interposed between the second portion P212 and the terminal TK2, and electrically connects the second portion P212 and the terminal TK2. Although the illustration is omitted here, the wiring board F1 has the same configuration as the wiring board F2.

The light source driver 42 shown in FIG. 1 supplies a cathode voltage and an anode voltage from the power supply 43 to each of the light-emitting element 2a and the light emitting element 2b. The cathode voltage of the light-emitting elements 2a and 2b is supplied from the power supply 43 to the terminal OT1 of the display panel 1 via the cable CB1, the relay board 5 and the wiring board 31, for example. The anode voltage of the light-emitting elements 2a and 2b is supplied from the power supply 43 to the terminal OT2 of the display panel 1 via the cable CB2, the relay board 5 and the wiring board 32, for example.

The cathode voltage and the anode voltage of the light-emitting element 2b are supplied from the terminals OT1 and OT2 of the display panel 1 connected to the wiring boards F31 and F32 to the terminals RE1 and RE2 via wiring lines. The terminals RE1 and RE2 are electrically connected to the conductive layers 71 and 72 via conductive members, respectively, in the first area A1. The conductive layers 71 and 72 extend from the first area A1 to the second area A2, and are electrically connected to the terminals T21 and T22 via conductive members, respectively, in the second area A2. The terminals T21 and T22 are electrically connected to the terminals TK2 and TA2 of the wiring board F2 via the overlapping connecting members 62, respectively. In the wiring board F2, the terminals TK2 and TA2 are electrically connected to the terminals EA and EK via the wiring lines LA and LB. The terminals EA and EK are connected to the overlapping cathode electrode and anode electrode of the light-emitting element 2b so that the cathode voltage and the anode voltage are supplied to the light-emitting element 2b.

In addition, the cathode voltage and the anode voltage of the light-emitting element 2a are supplied from the terminals OT1 and OT2 of the display panel 1 connected to the wiring boards F31 and F32 to the terminals T11 and T12 via wiring lines. The terminals T11 and T12 are electrically connected to terminals provided in the wiring board F1 via the overlapping connecting members 61, respectively. In the wiring board F1, as is the case in the wiring board F2, the cathode voltage and the anode voltage are supplied to the cathode electrode and the anode electrode of the light-emitting element 2a.

As described above, according to the present embodiment, the wiring board F2 located on the opposite side to the wiring boards F31 and F32 across the liquid crystal layer LC is electrically connected to the wiring boards F3 via the conductive layers 71 and 72. The conductive layers 71 and 72 are formed on the side surfaces SY1 and SY2 of the transparent substrate 10 by applying a conductive paste. In other words, the wiring board F2 and the wiring board F3 can be electrically connected together without connecting cables or other wiring boards to the wiring board F2. Therefore, a housing for accommodating cables or wiring boards connected to the wiring board F2 is not required, and designability is improved.

In addition, as is the case with the wiring board F2, the wiring board F1 is electrically connected to the wiring boards F31 and F32. That is, the wiring board F1 is located within the range of the first area A1 without extending more outward than the display panel 1. According to this configuration, a wiring board having the same configuration as the wiring board F2 can be used as the wiring board F1. In addition, the supply routes of the control signals of the light-emitting elements 2a and 2b, the gate drivers GD and the source driver SD can be consolidated into the wiring boards F31 and F32, and the wiring boards F31 and F32 and the like can be easily accommodated in a housing.

Furthermore, the conductive layers 71 and 72 contain a metal material, and function as a reflective layer. Since these conductive layers 71 and 72 are arranged over the entire side surfaces SY1 and SY2, light propagating inside the transparent substrate 10 and reaching the side surfaces SY1 and SY2 can be reflected effectively. That is, leak light from the transparent substrate 10 can be suppressed, and light reaching the side surfaces SY1 and SY2 can be reused. Therefore, the luminance reduction of the display panel 1 can be suppressed.

Figure 8:
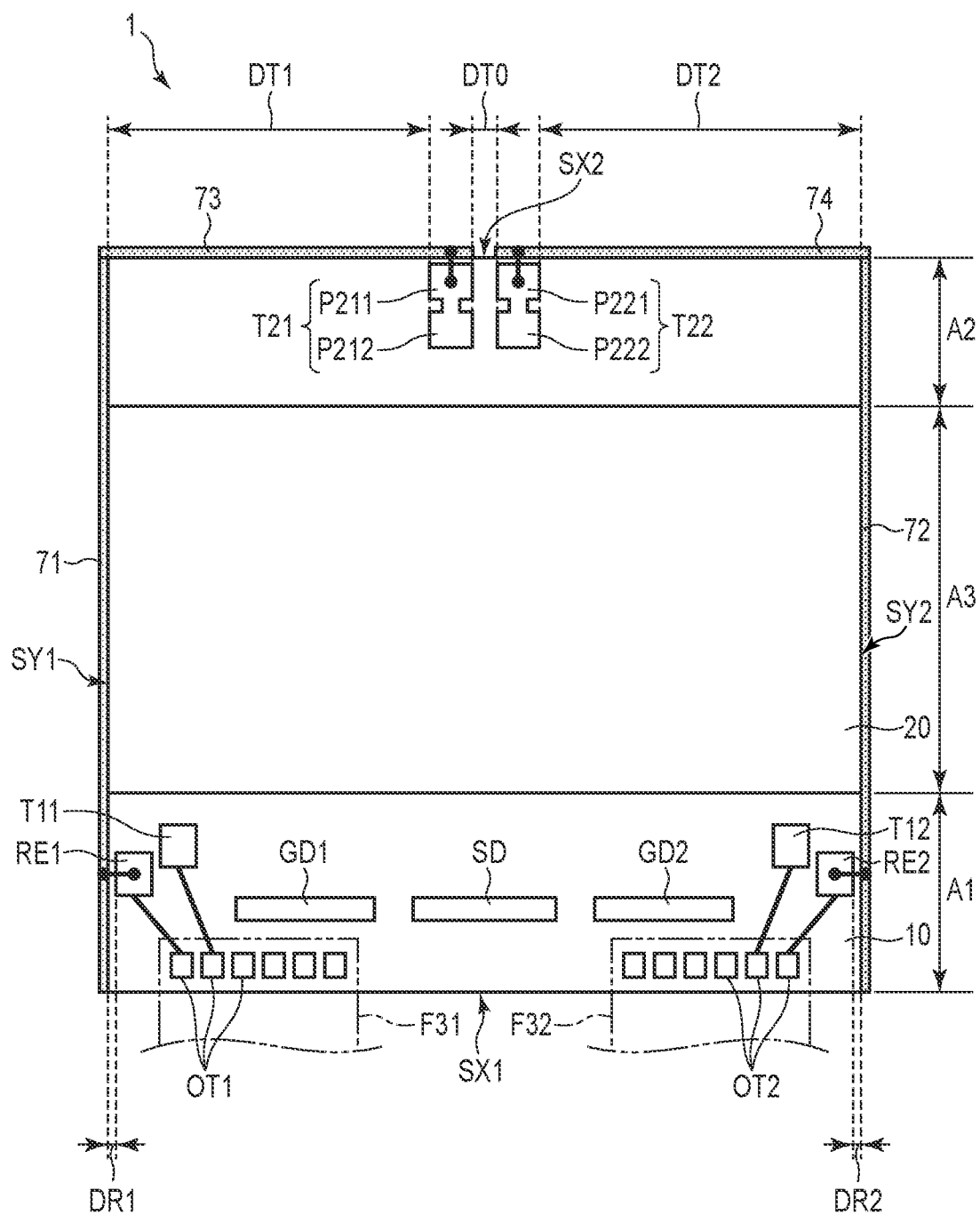
FIG. 8 is a plan view showing the first modification example of the display panel.

FIG. 8 is a plan view showing the first modification example of the display panel 1. The first modification example is different from the example shown in FIG. 5 in that conductive layers 73 and 74 are arranged on the side surface SX2. The conductive layer 73 and the conductive layer 74 are apart from each other, and are not electrically connected. The conductive layer 73 is located on the side surface SY1 side, and is electrically connected to the conductive layer 71. That is, the terminal RE1 of the first area A1 and the terminal T21 of the second area A2 are electrically connected via the conductive layers 71 and 73. The conductive layer 74 is located on the side surface SY2 side, and is electrically connected to the conductive layer 72. That is, the terminal RE2 of the first area A1 and the terminal T22 of the second area A2 are electrically connected via the conductive layers 72 and 74. The conductive layers 73 and 74 are formed of, for example, the same material as the conductive layers 71 and 72.

In the second area A2, the terminals T21 and T22 are located close to the center in the first direction X. That is, both the distance DT1 between the terminal T21 and the side surface SY1 and the distance DT2 between the terminal T22 and the side surface SY2 are greater than the distance DT0 between the terminal T21 and the terminal T22. In the illustrated example, the terminal T21 is farther from the side surface SY1 than the terminal RE1, and the terminal T22 is farther from the side surface SY2 than the terminal RE2. That is, the distance DT1 is greater than the distance DR1, and the distance DT2 is greater than the distance DR2.

In the first modification example, the first portion P211 and the second portion P212 provided in the terminal T21 are arranged in the second direction Y. The first portion P221 and the second portion P222 provided in the terminal T22 are arranged in the second direction Y. The first portions P211 and P221 are closer to the side surface SX2 than the second portions P212 and P222.

Figure 9:
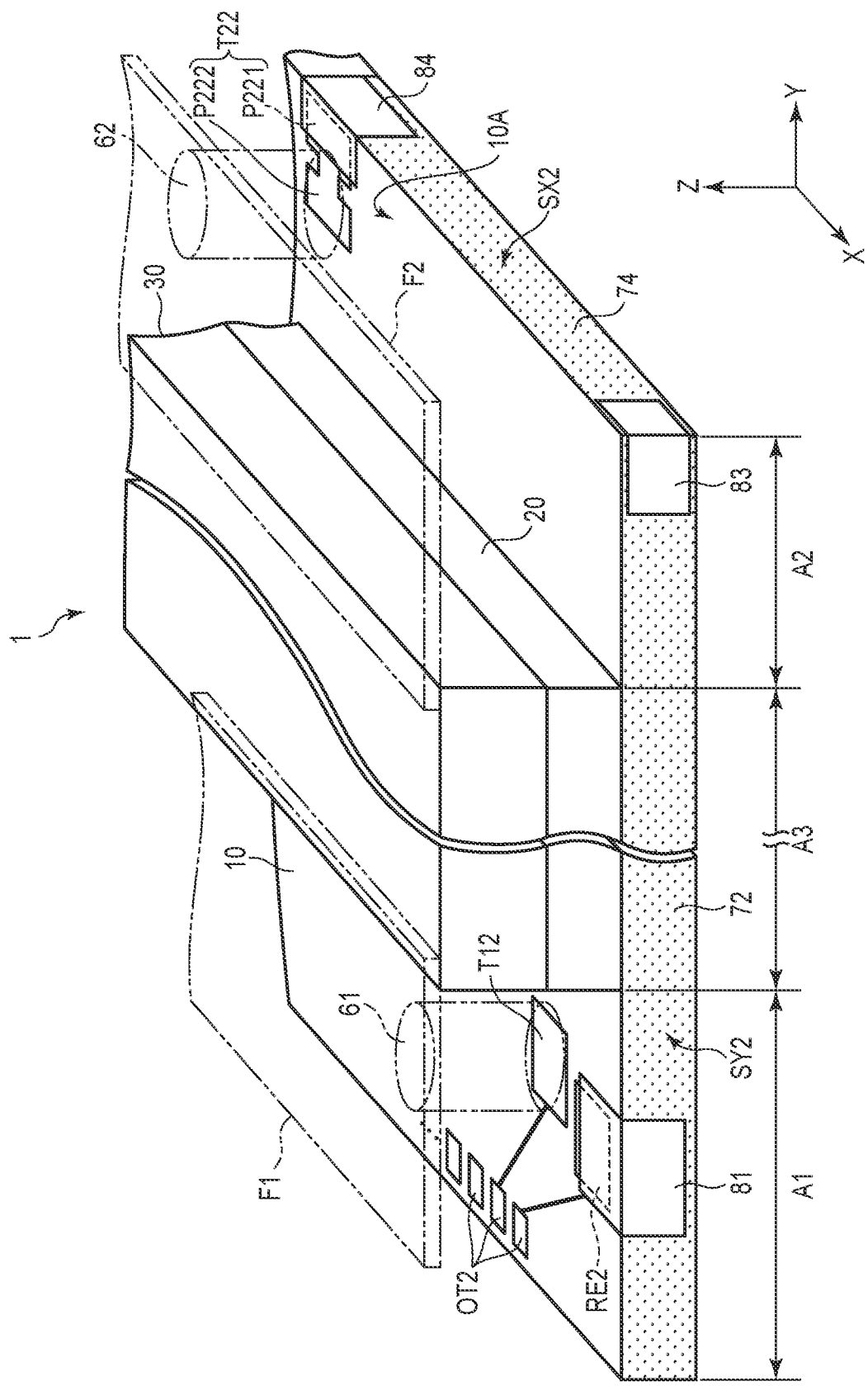
FIG. 9 is a perspective view of the display panel shown in FIG. 8.

FIG. 9 is a perspective view of the display panel 1 shown in FIG. 8. The display device DSP comprises conductive members 83 and 84 in addition to the conductive member 81. The conductive member 83 electrically connects the conductive layer 72 and the conductive layer 74. That is, the conductive member 83 is arranged over the side surface SY2 and the side surface SX2 in the second area A2, and are in contact with the conductive layer 72 and the conductive layer 74. The conductive member 84 electrically connects the terminal T22 and the conductive layer 74. That is, the conductive member 84 is arranged over the main surface 10A and the side surface SX2 in the second area A2, and is in contact with the terminal T22 and the conductive layer 74. The conductive members 83 and 84 each are, for example, a bendable sheet-shaped member such as a flexible wiring board or a conductive tape, but may each employ another conductive member such as a conductive resin. By providing these conductive members 83 and 84, it is possible to suppress electric rupture at the boundary between the side surface SY2 and the side surface SX2 and at the boundary between the main surface 10A and the side surface SX2.

The terminal T22 is in contact with both the conductive member 84 and the connecting member 62. That is, the first portion P221 of the terminal T22 corresponds to a portion overlapping the conductive member 84, and the second portion P222 of the terminal T22 corresponds to a portion overlapping the connecting member 62. As described above, the second portion P222 is farther from the side surface SX2 than the first portion P221. That is, the first portion P221 is located between the side surface SX2 and the second portion P222 in the second direction Y. Therefore, the connecting member 62 is farther from the side surface SX2 than the conductive member 84 in the second direction Y.

Figure 10:
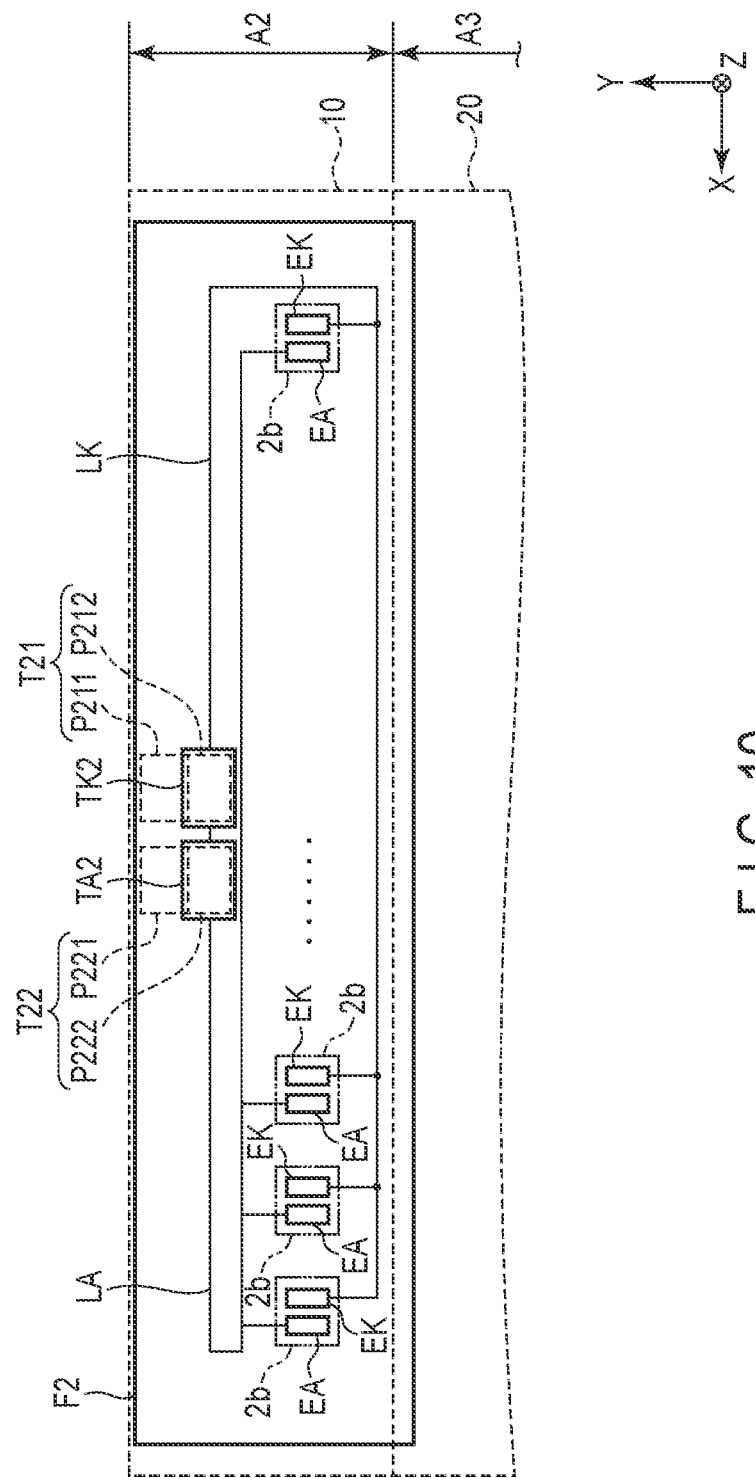
FIG. 10 is a plan view showing a configuration example of the wiring board overlapping the second area shown in FIG. 8.

FIG. 10 is a plan view showing a configuration example of the wiring board F2 overlapping the second area A2 shown in FIG. 8. In the wiring board F2, the terminal TA2 and the terminal TK2 are located almost in the center in the first direction X. The terminal TA2 overlaps the second portion P222 of the terminal T22 arranged on the transparent substrate 10. The terminal TK2 overlaps the second portion P212 of the terminal T12 arranged on the transparent substrate 10.

Also in the first modification example, the same effects as those obtained in the example shown in FIG. 5 can be obtained. Furthermore, according to the first modification example, the side surface SX2 is almost entirely covered with the conductive layers 73 and 74. Therefore, leak light from the side surface SX2 can be suppressed, and light reaching the side surface SX2 can be reused. Therefore, the luminance reduction of the display panel 1 can be further suppressed.

Figure 11:
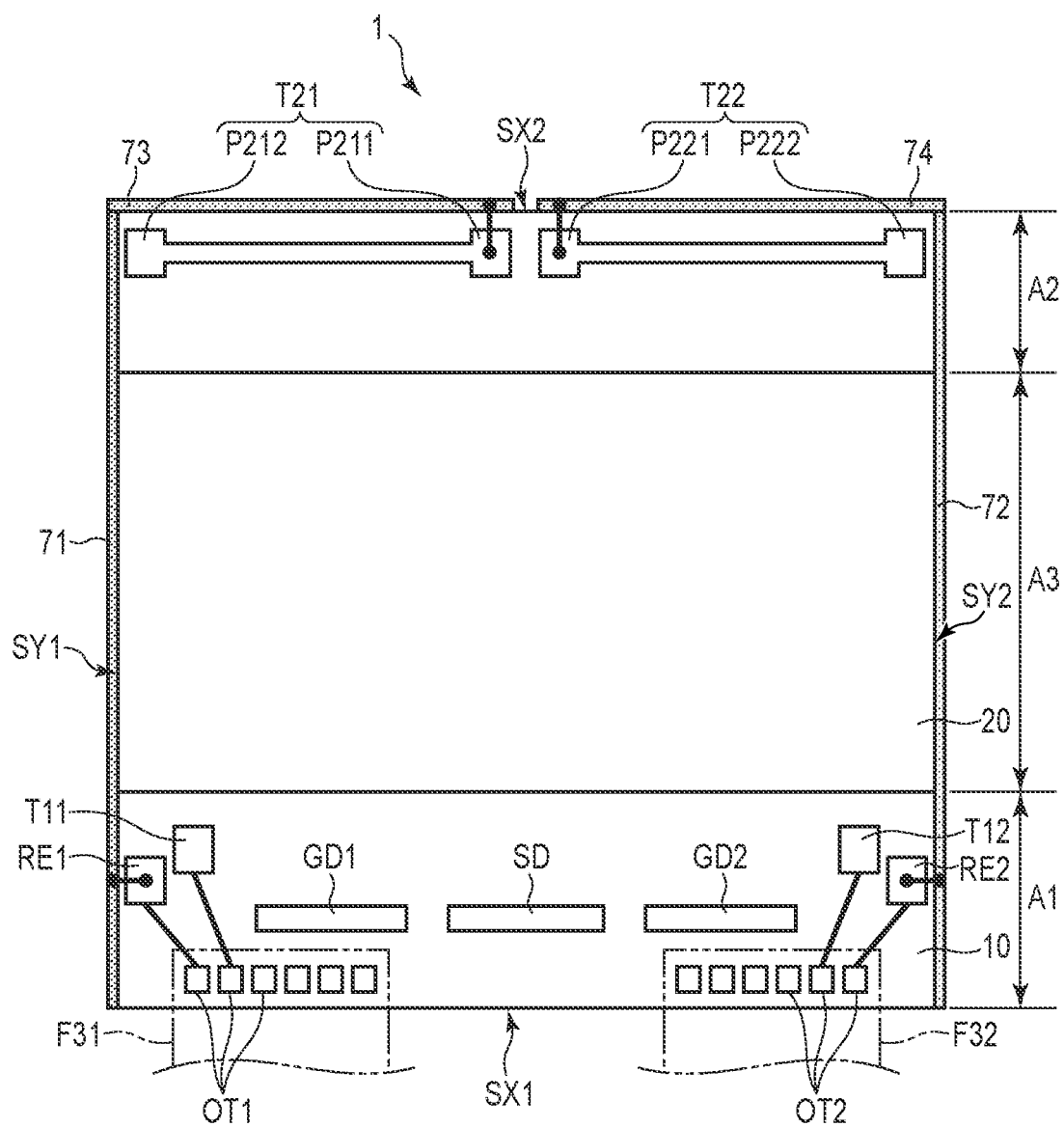
FIG. 11 is a plan view showing the second modification example of the display panel.

FIG. 11 is a plan view showing the second modification example of the display panel 1. The second modification example is different from the first modification example in that the second portion P212 of the terminal T21 is close to the side surface SY1, and the second portion P222 of the terminal T22 is close to the side surface SY2. In the second modification example, the wiring board F2 shown in FIG. 7 is arranged above the second area A2. Also in the second modification example, the conductive layers 73 and 74 are disposed on the side surface SX2. Therefore, the same effects as those obtained in the first modification example can be obtained.

As described above, according to the present embodiment, the designability of the display device 1 can be improved, and the degradation of display quality can be suppressed.

In the present embodiment, the transparent substrate 10 corresponds to the first transparent substrate, the transparent substrate 20 corresponds to the second transparent substrate, and the transparent substrate 30 corresponds to the third transparent substrate. The side surface SY2 of the transparent substrate 10 corresponds to the first side surface, and the side surface SX2 corresponds to the second side surface, and the side surface SY1 corresponds to the third side surface. The wiring board F1 corresponds to the first wiring board, and the light-emitting element 2a corresponds to the first light-emitting element. The wiring board F2 corresponds to the second wiring board, and the light-emitting element 2b corresponds to the second light-emitting element. The wiring board F32 corresponds to the third wiring board. The conductive member 81 corresponds to the first conductive member, the conductive member 82 corresponds to the second conductive member, the conductive member 83 corresponds to the third conductive member, and the conductive member 84 corresponds to the fourth conductive member.

In addition, the terminals RE and RE2 correspond to the first terminal. The terminals T2 and T22 correspond to the second terminal or the second lower terminal. The terminals T1 and T12 correspond to the third terminal or the first lower terminal. The terminal RE1 corresponds to the fourth terminal. The terminal T21 corresponds to the fifth terminal. The terminal TA1 corresponds to the first upper terminal. The terminal TA2 corresponds to the second upper terminal. The conductive layer 72 corresponds to the first conductive layer or the first reflective layer. The conductive layer 74 corresponds to the second conductive layer or the second reflective layer. The conductive layer 71 corresponds to the third reflective layer. The conductive layer 73 corresponds to the fourth reflective layer. The end portion E30a corresponds to the first end portion. The end portion E30b corresponds to the second end portion.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A display device comprising:
a first transparent substrate having a first area, a second area, a third area located between the first area and the second area, and a first side surface extending over the first area, the second area and the third area;
a second transparent substrate opposed to the first transparent substrate in the third area;
a polymer dispersed liquid crystal layer held between the first transparent substrate and the second transparent substrate, and containing a polymer and liquid crystal molecules;
a third transparent substrate arranged on the second transparent substrate, and having a first end portion between the first area and the third area and a second end portion between the second area and the third area;
a first wiring board located directly above the first area, and mounted with a first light-emitting element opposed to the first end portion;
a second wiring board located directly above the second area, and mounted with a second light-emitting element opposed to the second end portion;
a power supply supplying power to the first light-emitting element and the second light-emitting element;
a first terminal arranged in the first area, and electrically connected to the power supply;
a second terminal opposed to the second wiring board in the second area, and electrically connected to the second wiring board;
a first conductive layer arranged on the first side surface, and electrically connected to the first terminal and the second terminal;
a first conductive member electrically connecting the first terminal and the first conductive layer;
a second conductive member electrically connecting the second terminal and the first conductive layer; and a connecting member arranged between the second wiring board and the second terminal, and electrically connecting the second wiring board and the second terminal, wherein
the second terminal has a first portion overlapping the second conductive member, and a second portion overlapping the connecting member.

2. The display device of claim 1, further comprising a third terminal opposed to the first wiring board in the first area, and electrically connected to the first wiring board, wherein
a distance from the first side surface to the third terminal is greater than a distance from the first side surface to the first terminal.

3. The display device of claim 1, wherein the first conductive layer contains a metal material, and entirely covers the first side surface.

4. A display device comprising:
a first transparent substrate having a first area, a second area, a third area located between the first area and the second area, and a first side surface extending over the first area, the second area and the third area;
a second transparent substrate opposed to the first transparent substrate in the third area;
a polymer dispersed liquid crystal layer held between the first transparent substrate and the second transparent substrate, and containing a polymer and liquid crystal molecules;
a third transparent substrate arranged on the second transparent substrate, and having a first end portion between the first area and the third area and a second end portion between the second area and the third area;
a first wiring board located directly above the first area, and mounted with a first light-emitting element opposed to the first end portion;
a second wiring board located directly above the second area, and mounted with a second light-emitting element opposed to the second end portion;
a power supply supplying power to the first light-emitting element and the second light-emitting element;
a first terminal arranged in the first area, and electrically connected to the power supply;
a second terminal opposed to the second wiring board in the second area, and electrically connected to the second wiring board;
a first conductive layer arranged on the first side surface, and electrically connected to the first terminal and the second terminal;
a second conductive layer electrically connected to the first conductive layer,
a third conductive member electrically connecting the first conductive layer and the second conductive layer; and
a fourth conductive member electrically connecting the second terminal and the second conductive layer, wherein
the first transparent substrate has a second side surface intersecting the first side surface and extending along the second area, and
the second conductive layer is arranged on the second side surface.

5. The display device of claim 4, further comprising a connecting member arranged between the second wiring board and the second terminal, and electrically connecting the second wiring board and the second terminal, wherein
the second terminal has a first portion overlapping the fourth conductive member, and a second portion overlapping the connecting member.

6. The display device of claim 4, wherein a distance from the first side surface to the second terminal is greater than a distance from the first side surface to the first terminal.

7. A display device comprising:
- a first transparent substrate having a first area, a second area, and a third area located between the first area and the second area;
- a second transparent substrate opposed to the first transparent substrate in the third area;
- a liquid crystal layer held between the first transparent substrate and the second transparent substrate;
- a first lower terminal arranged in the first area;
- a second lower terminal arranged in the second area;
- a first wiring board located directly above the first area, and having a first upper terminal opposed to the first lower terminal;
- a second wiring board located directly above the second area, and having a second upper terminal opposed to the second lower terminal;
- a first light-emitting element mounted on the first wiring board, and electrically connected to the first upper terminal;
- a second light-emitting element mounted on the second wiring board, and electrically connected to the second upper terminal;
- a first connecting member arranged between the first lower terminal and the first upper terminal, and electrically connecting the first lower terminal and the first upper terminal; and
- a second connecting member arranged between the second lower terminal and the second upper terminal, and electrically connecting the second lower terminal and the second upper terminal; and
- a first terminal arranged in the first area, and electrically insulated from the first lower terminal, wherein
- the first terminal is electrically connected to the second lower terminal.

8. The display device of claim 7, wherein
the first transparent substrate further has a first side surface extending over the first area, the second area and the third area, and
the display device further comprises a first conductive layer arranged on the first side surface, and electrically connected to the first terminal and the second lower terminal.

9. The display device of claim 7, wherein the first terminal is located between the first side surface and the first lower terminal.

10. The display device of claim 9, wherein
the second lower terminal has a first portion and a second portion,
the first portion is located between the first conductive layer and the second portion, and
the second portion overlaps the second connecting member.

11. A display device comprising:
- a first transparent substrate having a first area, a second area, a third area located between the first area and the second area, a first side surface extending over the first area, the second area and the third area, a second side surface intersecting the first side surface, and a third side surface located on an opposite side to the first side surface;
- a second transparent substrate overlapping the first transparent substrate in the third area;
- a liquid crystal layer held between the first transparent substrate and the second transparent substrate;
- a third terminal arranged in the first area;
- a first terminal arranged in the first area, and located between the first side surface and the third terminal;
- a fourth terminal arranged in the first area, and located between the third side surface and the third terminal;
- a second terminal and a fifth terminal arranged in the second area, and arranged along the second side surface;
- a first reflective layer having conductivity, and arranged on the first side surface;
- a third reflective layer having conductivity, and arranged on the third side surface;
- a second reflective layer having conductivity, arranged close to the first side surface on the second side surface, and electrically connected to the first reflective layer; and
- a fourth reflective layer having conductivity, arranged close to the third side surface on the second side surface, electrically connected to the third reflective layer, and being apart from the second reflective layer, wherein
the first terminal and the second terminal are electrically connected via the first reflective layer and the second reflective layer, and
the fourth terminal and the fifth terminal are electrically connected via the third reflective layer and the fourth reflective layer.

12. The display device of claim 11, wherein
a distance from the first side surface to the second terminal is greater than a distance from the first side surface to the first terminal, and
a distance from the third side surface to the fifth terminal is greater than a distance from the third side surface to the fourth terminal.

* * * * *